(12) United States Patent
Johnstone et al.

(10) Patent No.: US 10,712,077 B2
(45) Date of Patent: Jul. 14, 2020

(54) ARRANGEMENT FOR CRYOGENIC COOLING

(71) Applicant: Siemens Healthcare Limited, Camberley (GB)

(72) Inventors: Adam Paul Johnstone, Thame (GB); Jonathan Noys, Abingdon (GB); Michael Simpkins, Buckinghamshire (GB); John Anthony Robert Teah, Berkshire (GB)

(73) Assignee: Siemens Healthcare Limited, Camberley (GB)

( * ) Notice: Subject to any disclaimer, the term of this patent is extended or adjusted under 35 U.S.C. 154(b) by 0 days.

(21) Appl. No.: 15/509,340

(22) PCT Filed: Aug. 17, 2015

(86) PCT No.: PCT/EP2015/068846
§ 371 (c)(1),
(2) Date: Mar. 7, 2017

(87) PCT Pub. No.: WO2016/037802
PCT Pub. Date: Mar. 17, 2016

(65) Prior Publication Data
US 2017/0284726 A1 Oct. 5, 2017

(30) Foreign Application Priority Data

Sep. 8, 2014 (GB) .................................. 1415826.5

(51) Int. Cl.
*F25B 9/00* (2006.01)
*F25D 19/00* (2006.01)
(Continued)

(52) U.S. Cl.
CPC .......... *F25D 19/006* (2013.01); *F25B 23/006* (2013.01); *G01R 33/3804* (2013.01);
(Continued)

(58) Field of Classification Search
CPC ...... F25B 9/00; F25B 9/10; F25B 9/14; F25B 9/145; F25J 1/00; F25J 2270/912;
(Continued)

(56) References Cited

U.S. PATENT DOCUMENTS 4,578,962 A 4/1986 Dustmann
4,680,936 A 7/1987 Sarwinski et al.
(Continued)

FOREIGN PATENT DOCUMENTS

CN 202275681 U 6/2012
CN 103413645 A 11/2013
(Continued)

*Primary Examiner* — Frantz F Jules
*Assistant Examiner* — Erik Mendoza-Wilkenfel
(74) *Attorney, Agent, or Firm* — Schiff Hardin LLP

(57) ABSTRACT

An arrangement for cryogenic cooling includes a cryogen tank, a cryogenic recondensing refrigerator arranged to cool a heat exchanger that is exposed to the interior of the cryogen tank, and an arrangement for conducting heat from a cooled article to the cryogen tank. A further cryogen tank is provided below the heat exchanger and arranged to receive cryogen liquid recondensed on the heat exchanger.

12 Claims, 4 Drawing Sheets

(51) Int. Cl.
  *H01F 6/04* (2006.01)
  *F25B 9/02* (2006.01)
  *F25B 9/14* (2006.01)
  *G01R 33/38* (2006.01)
  *G01R 33/3815* (2006.01)
  *F25B 23/00* (2006.01)

(52) U.S. Cl.
  CPC ........... *G01R 33/3815* (2013.01); *H01F 6/04* (2013.01); *F25B 2400/17* (2013.01)

(58) Field of Classification Search
  CPC ........ H01B 12/00; H01B 12/14; H01B 12/16; H01F 6/04; H01F 6/06; F04B 37/08; F04B 37/085; B01D 8/00; F17C 2227/0353; F25D 19/006
  See application file for complete search history.

(56) References Cited

U.S. PATENT DOCUMENTS

| | | | |
|---|---|---|---|
| 7,509,815 B2 * | 3/2009 | van Hasselt | H01L 39/20 335/216 |
| 9,683,759 B2 | 6/2017 | Ackermann et al. | |
| 2006/0135370 A1 | 6/2006 | Hasselt | |
| 2006/0242968 A1 | 11/2006 | Mita et al. | |
| 2007/0062203 A1 | 3/2007 | Hasselt | |
| 2007/0089432 A1 * | 4/2007 | Boesel | F25D 19/006 62/51.1 |
| 2008/0209919 A1 | 9/2008 | Ackermann et al. | |
| 2009/0094992 A1 * | 4/2009 | Wang | F25B 9/10 62/6 |
| 2010/0001821 A1 * | 1/2010 | Diederichs | H01F 6/008 335/216 |
| 2010/0041976 A1 | 2/2010 | Gore et al. | |
| 2011/0179809 A1 * | 7/2011 | Zhang | G01R 33/3804 62/51.1 |
| 2013/0160975 A1 * | 6/2013 | Stautner | G01R 33/3804 165/104.22 |
| 2014/0329688 A1 * | 11/2014 | Aoki | G01R 33/3815 505/162 |

FOREIGN PATENT DOCUMENTS

| | | | | |
|---|---|---|---|---|
| GB | 2 436 136 B | | 2/2008 | |
| GB | 2 458 265 A | | 9/2009 | |
| JP | 54140495 A | * | 10/1979 | |
| JP | 54140495 A | * | 10/1979 | |
| JP | S54140495 A | | 10/1979 | |
| JP | S59151479 A | | 8/1984 | |
| JP | S61214588 A | | 9/1986 | |
| JP | H0311774 A | * | 1/1991 | ............ H01L 39/20 |
| JP | H09205016 A | | 8/1997 | |
| JP | H10135028 A | | 5/1998 | |
| JP | 2000058316 A | | 2/2000 | |
| JP | 2003159230 A | | 6/2003 | |
| JP | 2009004693 A | | 1/2009 | |
| JP | 2012178485 A | | 9/2012 | |
| JP | 2013118228 A | | 6/2013 | |

* cited by examiner

ARRANGEMENT FOR CRYOGENIC COOLING

BACKGROUND OF THE INVENTION

Field of the Invention

The present invention relates to the cryogenic cooling of sensitive equipment, particularly in the context of superconducting magnets for MRI (Magnetic Resonance Imaging) systems.

Description of the Prior Art

As is well known to those skilled in the art, superconducting magnets comprise coils of superconductive wire which require cooling to cryogenic temperature appropriate to the material of the superconducting wire to maintain their superconducting properties. This is commonly achieved by at least partially immersing coils of superconducting wire in liquid cryogen at its boiling point.

Different superconducting materials are known, and the cryogen must be chosen to have a boiling point below the superconducting transition temperature of the appropriate material. Liquid helium is often used. It has the lowest boiling point of all, about 4K, but is increasingly scarce and expensive.

To reduce consumption of helium, pipe cooled magnet systems have become available. FIG. 1 schematically illustrates the principle of a pipe cooled magnet. The pipe cooled arrangement may also be referred to as a thermosiphon.

The present invention will be particularly described with reference to cylindrical superconducting magnets, which have a number of superconducting coils 10 aligned along a horizontal axis A. Such magnets are also referred to as "solenoidal" magnets, even if their construction is not a solenoid in its true sense. However, the present invention is not limited to such magnets, and extends to other types of superconducting magnet as will be apparent to those skilled in the art.

In FIG. 1, a magnet structure 10 has axially aligned coils of superconducting wire retained in position by conventional means, such a thermosetting resin impregnation onto a mechanical support structure. Refrigerator 12 is a cryogenic recondensing refrigerator. It acts to cool a heat exchanger 13 which is exposed to the interior of a cryogen tank 14. At least one cooling pipe 16 encircles the magnet structure 10 and is in thermal contact with each coil. An inlet end of the cooling pipe 16 is connected to the cryogen tank 14 near a lower extremity thereof, and an outlet end of the cooling pipe is connected to the cryogen tank 14 nearer an upper extremity thereof.

The apparatus illustrated in FIG. 1 would be enclosed within an evacuated outer vacuum container (OVC) (not illustrated). Thermal radiation shields are typically provided located inside the OVC, surrounding the coils 10, pipe 16 and cryogen tank 14.

In operation, a liquid cryogen 15 is introduced into cryogen tank 14 at its boiling point. Cryogenic refrigerator 12 cools boiled-off cryogen vapor back to a liquid and maintains a stable temperature within the cryogen vessel. Heat generated in coils 10, or removed from the coils to cool them, causes boiling of cryogen within the cooling pipe 16. Boiled off cryogen vapor rises in the cooling pipe 16 to leave through the outlet end into the cryogen tank. The cryogen vapor is recondensed by refrigerator 12 into liquid cryogen 15. Cryogen thereby circulates into the inlet end of the cooling pipe 16, out of the outlet end of the cooling pipe and back into the cryogen vessel 14. In this way, the cooling effect of refrigerator 12 is distributed around the circumference of the coils 10.

A relatively small cryogen tank 14, with a relatively small mass of cryogen 15 is found sufficient to cool the magnet coils 10. However, such an arrangement has certain drawbacks.

Although not represented in the schematic illustration of FIG. 1, various electrical components such as superconducting joints, a superconducting switch, electrical connections and diagnostic sensors, dissipate energy as heat during various stages of the systems operation, and need to be cooled by the refrigerator 12. In arrangements such as represented in FIG. 1, the components can suffer from insufficient cooling. In some arrangements, the components may be mechanically and thermally attached to the exterior of cryogen tank 14 or cooling pipe 16, or may be attached to a surface of coils 10. The pipe cooling arrangement of FIG. 1 must be retained in a vacuum to enable effective operation. However, cooling of the components through mechanical contact has been found to be inefficient in a vacuum, as compared to cooling in contact with a cryogen liquid or gas as there is no cryogen to bridge any small contact gaps.

The superconducting magnet coils 10 have a high thermal conductivity, and so are easy to cool and to keep cool by cooling even just a small percentage of their surface area, in this example by pipes 16 which contain cold cryogens and are in thermal contact with at least certain regions of the surface of each coil.

When a magnet is energized, the coils must be cooled below the superconducting transition temperature of the relevant wire. Associated superconducting switches must be open to allow energization of the magnet. This involves heating the switches above the superconducting transition temperature of the relevant wire. If the coils 10 are not sufficiently cooled, this switch heating may reach the coils 10 of the magnet and prevent them achieving superconductive status. Once the magnet is energized, the switches must be rapidly cooled to regain their superconducting properties to enable the magnet to become persistent.

One possible arrangement for ensuring effective cooling of such components in a pipe cooled magnet such as represented in FIG. 1 provides the components inside the cryogen tank 14, in contact with the liquid cryogen 15 to cool the components. While this ensures effective cooling, this arrangement does have some drawbacks. For example, the placing of such components within the cryogen tank 14 reduces the available volume of liquid cryogen available for cooling the magnet coils 10.

In the event of excessive cryogen boil off for any reason, the level of liquid cryogen 15 may drop below the level of the components. This may allow the components to heat above their superconducting transition temperature, which in turn could cause the magnet to quench.

During a quench, the liquid cryogen 15 in the cryogen tank 14 could be boiled off or expelled out of the cryogen tank 14. This may allow the components to heat above their superconducting transition temperature.

When a superconducting switch needs to be "open", heat must be applied. If this switch, and therefore also the heat, is contained within cryogen tank 14, more liquid cryogen 15 is evaporated. This could interrupt the flow of cryogen through the cooling pipe(s) 16.

The present invention may also be applied to other types of magnet, for example where coils 10 are cooled by thermal conduction through a thermal link, such as a metal braid, laminate or thermal busbar. In such arrangements, the liquid cryogen 15 does not circulate, but serves to maintain a constant temperature of the cryogen tank 14.

SUMMARY OF THE INVENTION

The present invention therefore addresses the above problems, to provide an arrangement for effective cooling of components in a pipe cooled or contact cooled superconducting magnet system, which avoids or reduces the effects of the above-mentioned drawbacks.

DESCRIPTION OF THE PREFERRED EMBODIMENTS

As recognized in conventional arrangements, the most effective method for cooling an item to a stable cryogenic temperature is to submerge the item in a cryogenic fluid at its boiling point. The cryogen is held in a closed vessel at saturation temperature and pressure. When heat is generated in the item, the cryogen that is closest to the heat absorbs the heat by vaporizing. The gaseous cryogen is much less dense than the liquid surrounding it so is displaced by other liquid cryogen and hence the heat is removed.

The difficulties discussed above with respect to placing cooled components within cryogen tank 14 arise because the cryogen in a same cryogen tank must serve to cool the electrical components and to provide cooling to the magnet coils 10. The cryogen may be expelled from cryogen tank 14 during a quench event.

In an embodiment of the present invention, a further cryogen tank is provided for housing the components within a quantity of liquid cryogen. This quantity of liquid cryogen and the further cryogen tank are in communication with the cryogen tank 14 through a constriction. Cryogen tank 14 and liquid cryogen 15 are used for cooling the magnet coils 10 as discussed above. Such arrangement allows excellent cooling of the components by direct contact with liquid cryogen, but avoids any of the difficulties associated with the use of a single cryogen volume for both cooling of magnet coils and cooling of the components.

The arrangement of the present invention does not require reduction of the liquid cryogen capacity of the cryogen tank 14.

The further cryogen tank is preferably arranged below the cryogen tank 14, to ensure that the components would be completely covered in liquid cryogen even when the level of liquid cryogen 15 within the cryogen tank 14 is low.

Figure 1:
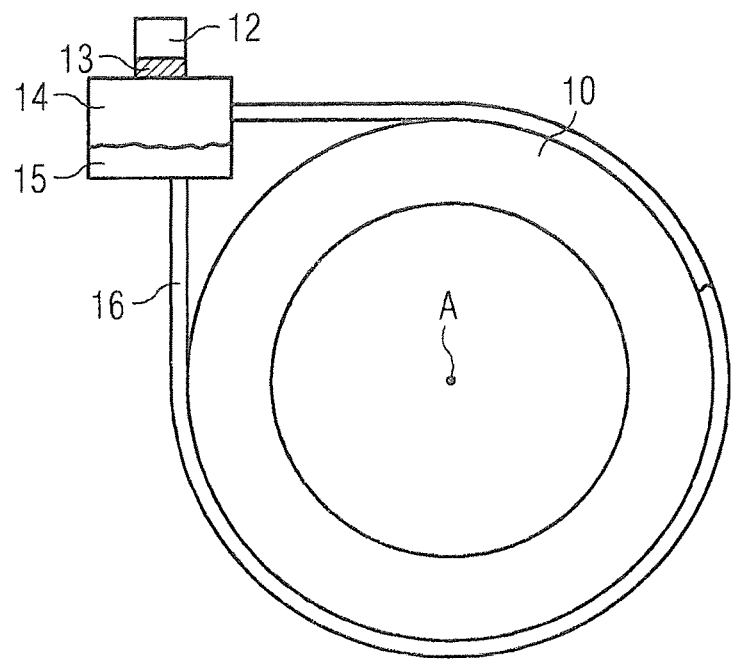
FIG. 1 schematically represents a conventional pipe cooled superconducting magnet.
Figure 2:
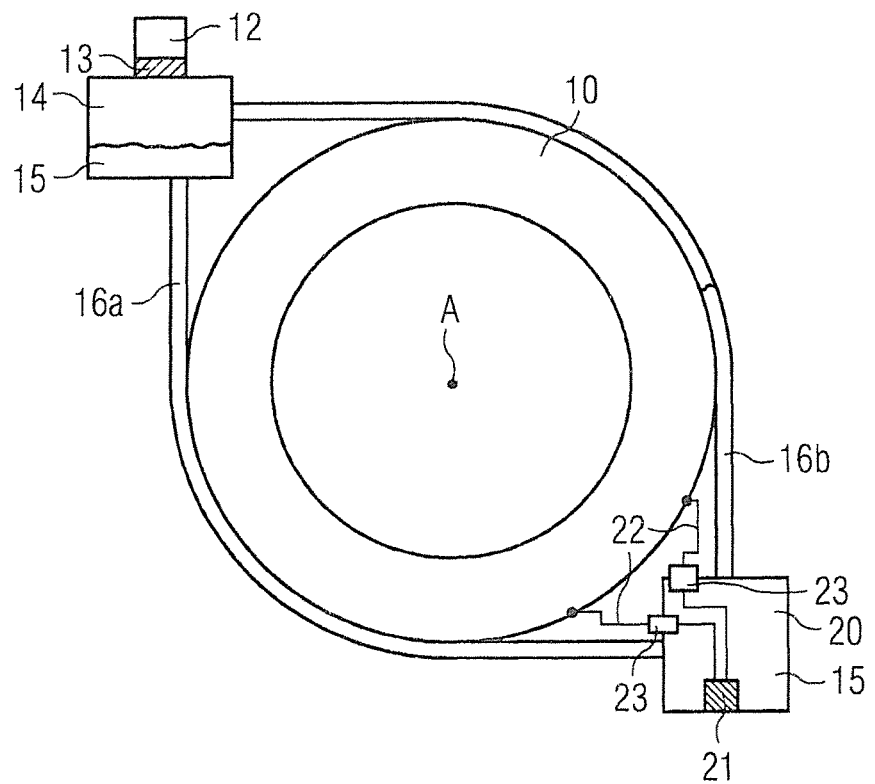
FIGS. 2-5 schematically represent pipe cooled superconducting magnets according to embodiments of the present invention.

FIG. 2 schematically illustrates a first embodiment of the invention. Features common with FIG. 1 show common reference numerals. In this embodiment, cooling pipe 16 is divided into an upstream portion 16a and a downstream portion 16b. Further cryogen tank 20 houses components 21. Electrical connections 22 are made between components 21 and the magnet coils 10. Electrical feedthroughs 23 are provided to allow an electrical path to the components 21 to extend through the wall of the further cryogen tank 20. Further cryogen tank 20 forms part of the cooling loop arrangement, in that a circulation path of cryogen flows from cryogen vessel 14, through inlet end of pipe 16, through further cryogen tank 20 and through outlet end of the pipe 16 back to the cryogen tank 14. Downstream portion 16b of the cooling pipe is attached to the further cryogen tank 20 near an upper extremity thereof, and to cryogen tank 14 near an upper extremity thereof. Upstream portion 16a of the cooling pipe 16 is connected to cryogen tank 14 and further cryogen tank 20 at locations below the respective connection of downstream portion 16b. Further cryogen tank 20 is located below cryogen tank 14, and may preferably be located at the lower extremity of cooling pipe 16a/16b. Further cryogen tank 20 is accordingly in communication with cryogen tank 14 through a constriction defined by cooling pipe 16.

In operation, further cryogen tank 20 fills preferentially with liquid cryogen. Under the influence of gravity, liquid cryogen 15 will fill further cryogen tank 20 first, and only once that is full will the cooling pipe 16 and cryogen tank 14 fill with liquid cryogen. The cooling loop itself will operate as described with reference to FIG. 1: heat from coils 10 will cause boiling of cryogen into vapor which will circulate through the pipe 16a/16b, entering the cryogen tank 14 though downstream portion 16b to be recondensed by the refrigerator 12 back into liquid cryogen 15 for recirculation through upstream portion 16a of the pipe. Any heat generated by the components 21, such as heat provided to open a superconducting switch, may cause boiloff of liquid cryogen, and the resulting cryogen vapor will rise and circulate through downstream portion 16b back to cryogen tank 14.

In some embodiments of the invention, multiple further cryogen vessels 20 may be provided, each accommodating sub-sets of the components 21 to be cooled and each in communication with cryogen tank 14 through a constriction. Similarly, multiple pipes 16, 16a/16b may be provided, or which one or more may be connected to a further cryogen tank 20.

Figure 3:
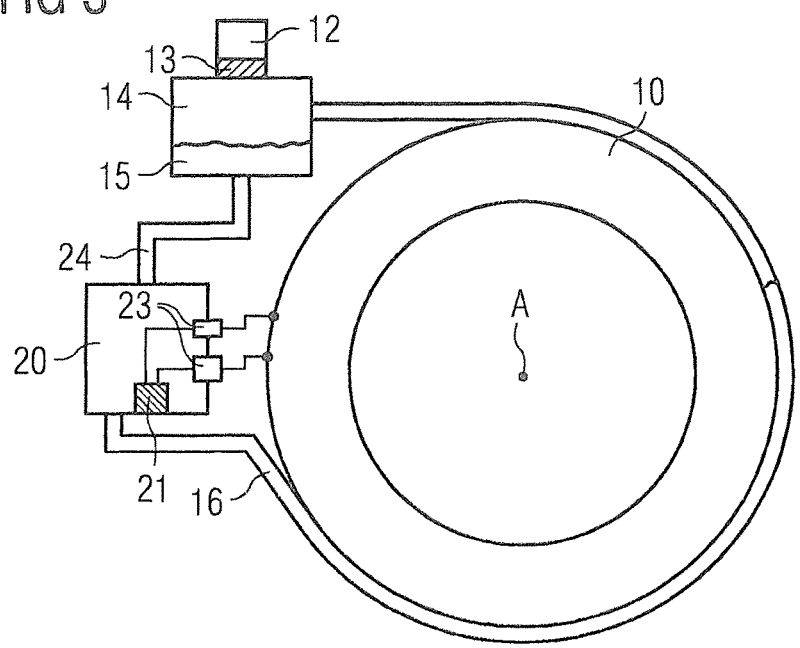

FIG. 3 schematically represents another embodiment of the present invention. In this arrangement, further cryogen tank 20 is located beneath cryogen tank 14, not at the lowest extremity of cooling pipe 16. A relatively short connecting pipe 24 extends essentially vertically between cryogen tank 14 and further cryogen tank 20 defining a constriction which ensures communication between cryogen tank 14 and further cryogen tank 20. The remaining features of this embodiment are as discussed with reference to FIG. 2.

In such embodiments, a lower part of pipe 16 will fill first with added liquid cryogen 15, and then the further cryogen tank 20 will fill, before connecting pipe 24 and then cryogen tank 14. Any heat generated within further cryogen tank 20 may cause cryogen to boil, and the resulting cryogen vapor will rise upwards through the constriction to cryogen tank 14, where it will be recondensed by refrigerator 12.

Figure 4:
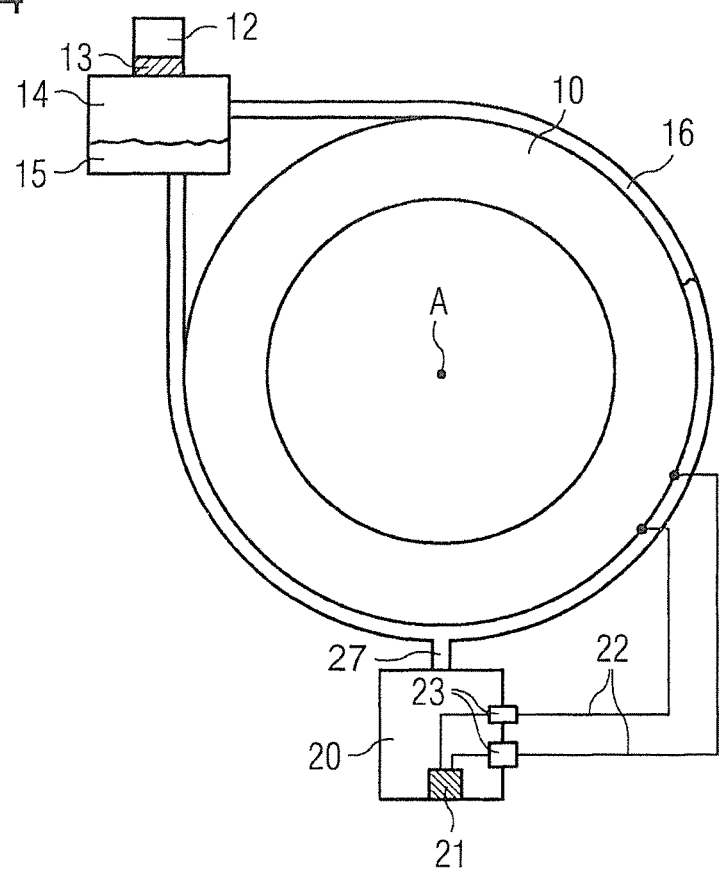

FIG. 4 shows another embodiment of the present invention. Here, the further cryogen tank 20 is fed from a tee 27 in the pipe 16. Further cryogen vessel 20 is in communication with cryogen vessel 14 through a constriction defined by pipe 16 and tee 27. While the further cryogen tank 20 will preferentially fill with liquid cryogen, the cryogen circulating in the pipe 16 will not necessarily pass through the further cryogen tank 20. Preferably, the further cryogen tank 20 is located such that cryogen vapor generated in the further cryogen tank 20 will rise through the constriction towards the cryogen tank 14 in the normal direction of circulation of cryogen in pipe 16.

Other arrangements may be found, but it is preferred that the further cryogen tank 20 should be positioned below the cryogen tank 10, in fluid communication therewith. The fluid communication through a constriction between cryogen tank 14 and further cryogen tank 20 need not form part of the cooling loop (thermosiphon) path.

Figure 5:
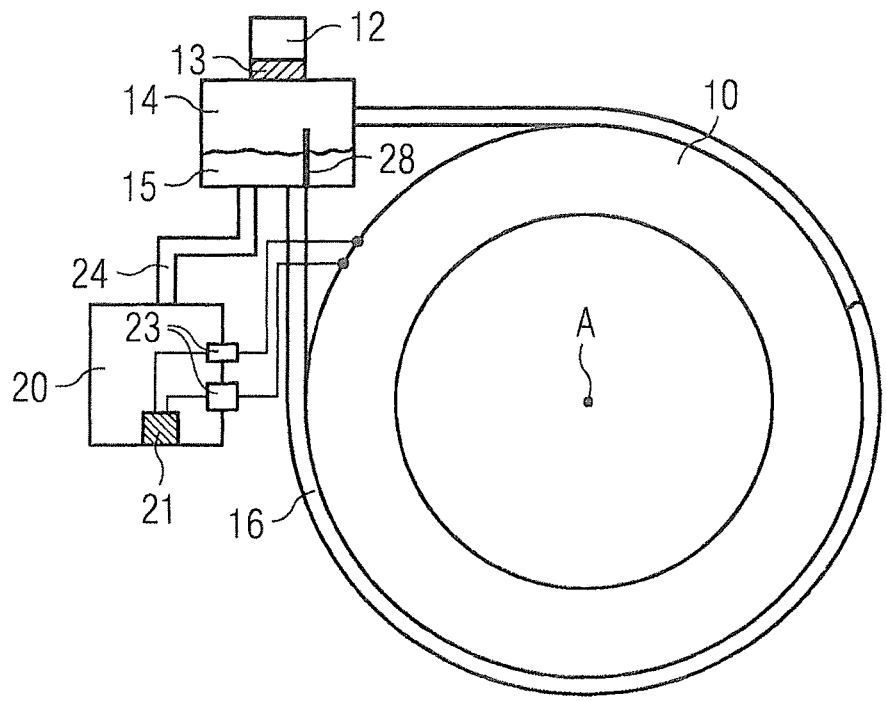

FIG. 5 illustrates an embodiment in which further cryogen tank 20 is connected to cryogen tank 14 by connecting pipe 24, separately from the cooling loop path of pipe 16, defining a constriction which provides fluid communication between further cryogen tank 20 and cryogen tank 14. As with other embodiments, further cryogen tank 20 will fill preferentially, before cryogen tank 14. A baffle 28 may be provided, as desired, to ensure that either the pipe 16, or the further cryogen tank 20, fills before the other. This may be arranged simply by selecting the relative position of the heat exchanger of the cryogenic refrigerator with respect to the baffle.

Figure 6:
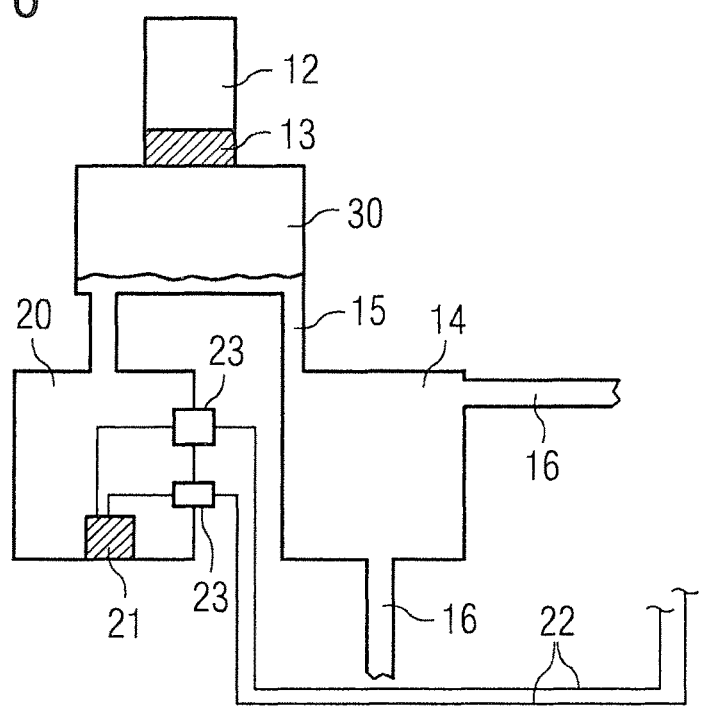
FIG. 6 shows a feature of certain embodiments of the present invention.

In yet other arrangements, as shown in FIG. 6, the cryogenic refrigerator 12 may provide liquid cryogen into a recondensing chamber 30, fluidly connected to both cryogen tank 14 and further cryogen tank 20. The recondensing chamber divides the liquid cryogen between the cryogen tank 14 and the further cryogen tank 20. The geometry of the recondensing chamber may be adjusted to determine which of the cryogen tank 14 and the further cryogen tank 20 will fill preferentially. Here, constrictions are provided by pipes linking further cryogen tank 20 and cryogen tank 14 to recondensing chamber 30.

Figure 7:
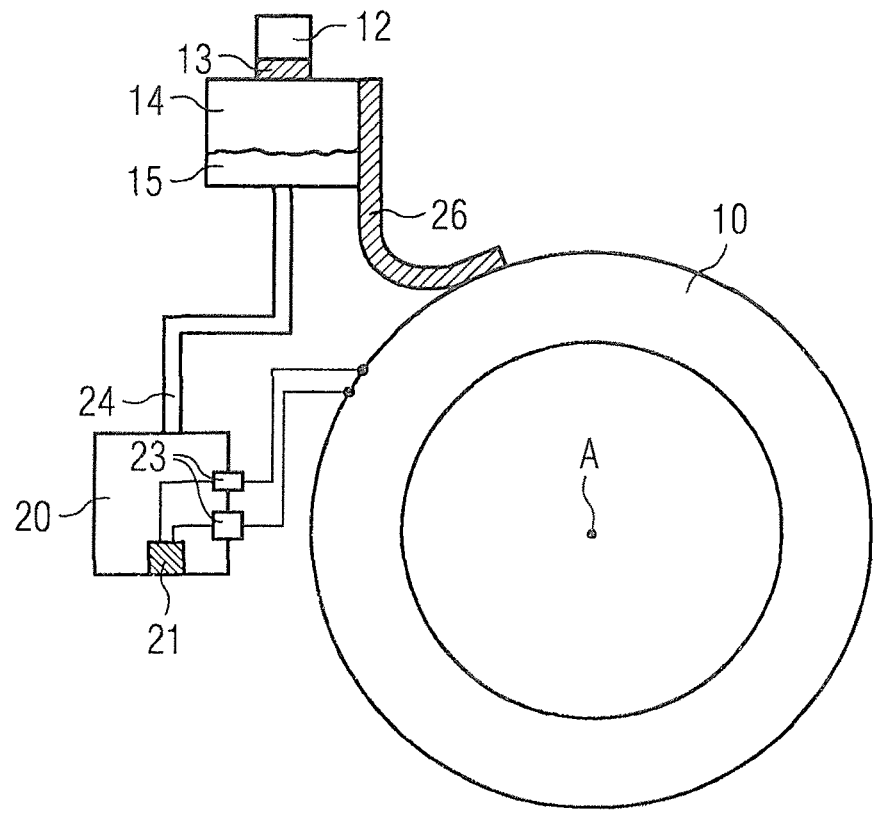
FIG. 7 represents a conduction cooled superconducting magnet according to an embodiment of the invention.

FIG. 7 schematically represents a further series of embodiments of the present invention. In FIG. 7, no cooling loop (thermosiphon) is provided. Instead of a pipe 16 carrying cryogen in a circuit to cool the coils, a solid thermal conductor 26 is provided, in thermal contact with the cryogen tank 14 and the coils 10. The solid thermal conductor 26 may be of any conventional type, such as a laminate, braid or thermal busbar of high purity aluminum, copper or other suitable material such as a composite containing aluminum or copper. In use, heat is transferred from coils 10 to cryogen tank 14 through solid thermal conductor 26. The heat will cause boiling of the liquid cryogen 15 in the cryogen tank 15, and the cryogen vapor will be recondensed by cryogenic refrigerator 12. In the illustrated embodiment, the further cryogen tank 20 is located beneath cryogen tank 14, connected by connecting pipe 24 defining a constriction, such that further cryogen tank 20 is preferentially filled with liquid cryogen. The remaining features in FIG. 7 are as described with reference to the earlier drawings. In some embodiments, a cooling loop may be provided in addition to the solid thermal conductor.

The variant illustrated in FIG. 6 where a recondensing chamber is provided to distribute liquid cryogen between cryogen tank 14 and further cryogen tank 20 may be applied to the arrangement of FIG. 7.

Figure 8:
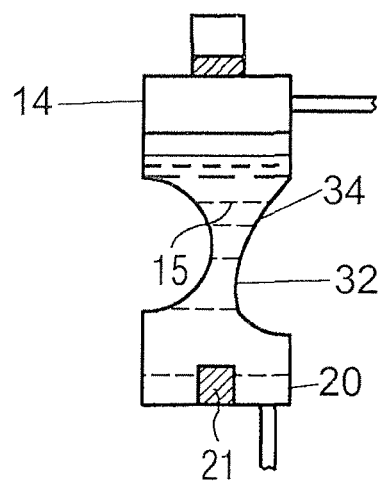
FIGS. 8-9 schematically represent cryogen vessels comprising a constriction, as employed in certain embodiments of the present invention.
Figure 9:
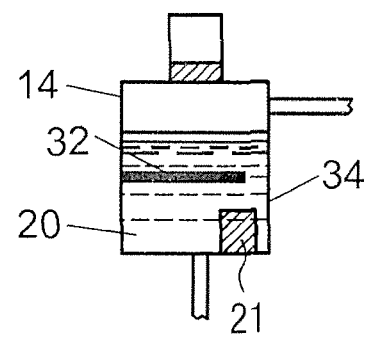

FIGS. 8 and 9 illustrate features of further embodiments of the present invention. In these embodiments, the cryogen tank 14 and further cryogen tank 20 are provided by subdivisions of a single vessel, and are linked by a constriction 32. In the arrangement of FIG. 8, the constriction is provided by shaping of the single vessel 34. In the arrangement of FIG. 9, the constriction is provided by a baffle arrangement.

Numerous other variants will be apparent to those skilled in the art, within the scope of the present invention as defined in the appended claims. Although described with reference to cooling of superconducting coils 10, the present invention may find application in the cryogenic cooling of other types of cooled article. Although the components 21 housed within the further cryogen tank have been described as particular types of electrical component, other types of electrical component, and indeed other types of component, may be cooled by placement within the further cryogen tank of the present invention.

The invention claimed is:

1. A cryogenic cooling arrangement in combination with a cooled article comprising:
   the cooled article;
   a first cryogen tank comprising a recondensing chamber, said first cryogen tank containing a cryogen liquid;
   a heat exchanger exposed to an interior of the first cryogen tank recondensing chamber;
   a cryogenic recondensing refrigerator in thermal contact with the heat exchanger;
   a heat transfer arrangement that conducts heat from the cooled article to the first cryogen tank while keeping said cryogen liquid out of direct contact with said cooled article;
   a second cryogen tank fluidly connected to the recondensing chamber of the first cryogen tank so as to receive cryogen liquid recondensed on the heat exchanger, the second cryogen tank housing components are cooled by the recondensed cryogen liquid received in the second cryogen tank; and
   said heat transfer arrangement comprising a cooling loop arrangement, said cooling loop arrangement comprising a pipe in thermal contact with the cooled article, an inlet end of said pipe being open to the first cryogen tank near a lower extremity the first cryogen tank, and an outlet end of said pipe being connected to the first cryogen tank nearer an upper extremity the first cryogen tank.

2. The cryogenic cooling arrangement according to claim 1, further comprising:
   a constriction linking the first and second cryogen tanks.

3. The cryogenic cooling arrangement according to claim 2, wherein the second cryogen tank is fluidly connected to receive cryogen liquid in preference to the first cryogen tank.

4. The cryogenic cooling arrangement according to claim 2 wherein the heat transfer arrangement comprises a solid thermal conductor.

5. The cryogenic cooling arrangement according to claim 2 wherein the second cryogen tank is located downstream of the inlet end, and upstream of the outlet end, in a normal direction of cryogen circulation in the pipe.

6. The cryogenic cooling arrangement according to claim 5 wherein the second cryogen tank is fed from a tee in the pipe.

7. The cryogenic cooling arrangement according to claim 5 wherein the second cryogen tank forms part of the cooling loop, being connected to the first cryogen tank by an upstream portion of the pipe and by a downstream portion of the pipe.

8. The cryogenic cooling arrangement according to claim 7 wherein the second cryogen tank is provided at a lower extremity of pipe.

9. The cryogenic cooling arrangement according to claim 2, wherein the first cryogen tank comprises a baffle, positioned in relation to the heat exchanger to determine which of the pipe and the second cryogen tank, fills before the other.

10. The cryogenic cooling arrangement according to claim 1 wherein a geometry of the recondensing chamber is configured to determine which of the first cryogen tank and the second cryogen tank will fill before the other.

11. The cryogenic cooling arrangement according to claim 1 wherein the cooled article, the first cryogen tank and the heat transfer arrangement are housed within an outer vacuum container.

12. The cryogenic cooling arrangement according to claim 1 wherein the cooled article comprises a superconducting magnet coil.

* * * * *